United States Patent [19]
Nakagawa et al.

[11] Patent Number: 5,714,896
[45] Date of Patent: Feb. 3, 1998

[54] FRACTIONAL-N FREQUENCY DIVIDER SYSTEM

[75] Inventors: Tadao Nakagawa; Tsuneo Tsukahara; Masao Suzuki; Tsutomu Kamoto, all of Kanagawa, Japan

[73] Assignee: Nippon Telegraph and Telephone Corporation, Tokyo, Japan

[21] Appl. No.: 608,559

[22] Filed: Feb. 28, 1996

[30] Foreign Application Priority Data

Mar. 6, 1995 [JP] Japan .................. 7-070466

[51] Int. Cl.$^6$ ............................................. H03K 21/00
[52] U.S. Cl. .................. 327/115; 327/117; 377/47; 377/48
[58] Field of Search ............... 327/115, 113, 327/117; 377/47, 48, 52, 107; 331/1 A

[56] References Cited

U.S. PATENT DOCUMENTS

| | | | |
|---|---|---|---|
| 4,918,403 | 4/1990 | Martin | 331/1 A |
| 5,202,906 | 4/1993 | Saito et al. | 327/115 |
| 5,224,132 | 6/1993 | Goldberg | 377/48 |

OTHER PUBLICATIONS

"Digital PLL Frequency Synthesizers", ROHDE, Prentice-Hall, Inc., pp. 124–141.
"The Common Denominators in Fractional N", Hassun, *Microwaves & RF*, Jun. 1984, pp. 107–110.
"A Short Survey of Frequency Synthesizer Techniques", Reinhardt et al, *40th Annual Frequency Control Symposium*, 1986, pp. 355–365.
"Technique Enhances the Performance of PLL Synthesizers", Miller, *Microwaves & RF*, Jan. 1993, pp. 59–65.
"Digital PLL Frequency Synthesizers", ROHDE, Prentice-Hall, Inc., pp. 276–280.
"Motorola MECL Integrated Circuits", 1983, pp. 7-72-7-85.

*Primary Examiner*—Timothy P. Callahan
*Assistant Examiner*—Eunja Shin
*Attorney, Agent, or Firm*—Nikaido Marmelstein Murray and Oram LLP

[57] ABSTRACT

A fractional-N frequency divider system generates an output signal having frequency of an input signal divided by a desired frequency division ratio (N+A/M) in which N is an integer and A/M is a fraction, A≦M, and includes a programmable frequency divider receiving input frequency and providing divided frequency in which division ratio (N, N+1) is an integer and is externally supplied, a selector supplying one of the externally supplied integers (N, N+1) to the divider according to a selection signal, and a fractional part set having a first counter initialized to count M, a second counter initialized to count A, and a logic circuit for supplying the selection signal according to the counters. The counters are decremented by an output of the divider and reach zero when they receive M and A number of pulses, respectively. The second counter stops counting operation when it reaches zero. The logic circuit makes the selector select an integer N in a condition when content of the first counter is not zero and content of the second counter is zero, and N+1 in other conditions, so that the division ratio in the divider is N+1 for A number of output pulses of the divider among M number of output pulses, and is N for M-A number of the output pulses.

8 Claims, 11 Drawing Sheets

| COUNT | OUTPUT | | | |
|---|---|---|---|---|
| | Q4 | Q3 | Q2 | Q1 |
| 15 | 1 | 1 | 1 | 1 |
| 14 | 1 | 1 | 1 | 0 |
| 13 | 1 | 1 | 0 | 1 |
| ⋮ | ⋮ | ⋮ | ⋮ | ⋮ |
| 2 | 0 | 0 | 1 | 0 |
| 1 | 0 | 0 | 0 | 1 |
| 0 | 0 | 0 | 0 | 0 |

FRACTIONAL-N FREQUENCY DIVIDER SYSTEM

BACKGROUND OF THE INVENTION

The present invention relates to a frequency divider, in particular, relates to a fractional-N frequency divider. The present invention relates also to a fractional-N frequency synthesizer using said fractional-N frequency divider, generating output frequency with step frequency which is smaller than reference frequency.

In mobile communication system, and/or multimedia communication system, it is tendency that carrier frequency is coming high, and spacing of channels is coming small, for providing high efficiency of frequency use. However, that tendency must increase frequency division ratio of a frequency synthesizer which is used in a local oscillator of a communication device, and the increase of frequency division ratio deteriorates phase noise characteristics. The phase noise generated in a local oscillator deteriorates error rate in a communication system like PSK or QAM communication system which has phase information.

Therefore, it is desired that reference frequency or input frequency to a frequency synthesizer is rather high so that frequency division ratio which is ratio of reference frequency to radio frequency is small. The small frequency division ratio provides low phase noise.

When frequency division ratio is small or reference frequency is high, and spacing of channels is small, frequency division ratio must be fractional.

Figure 6:
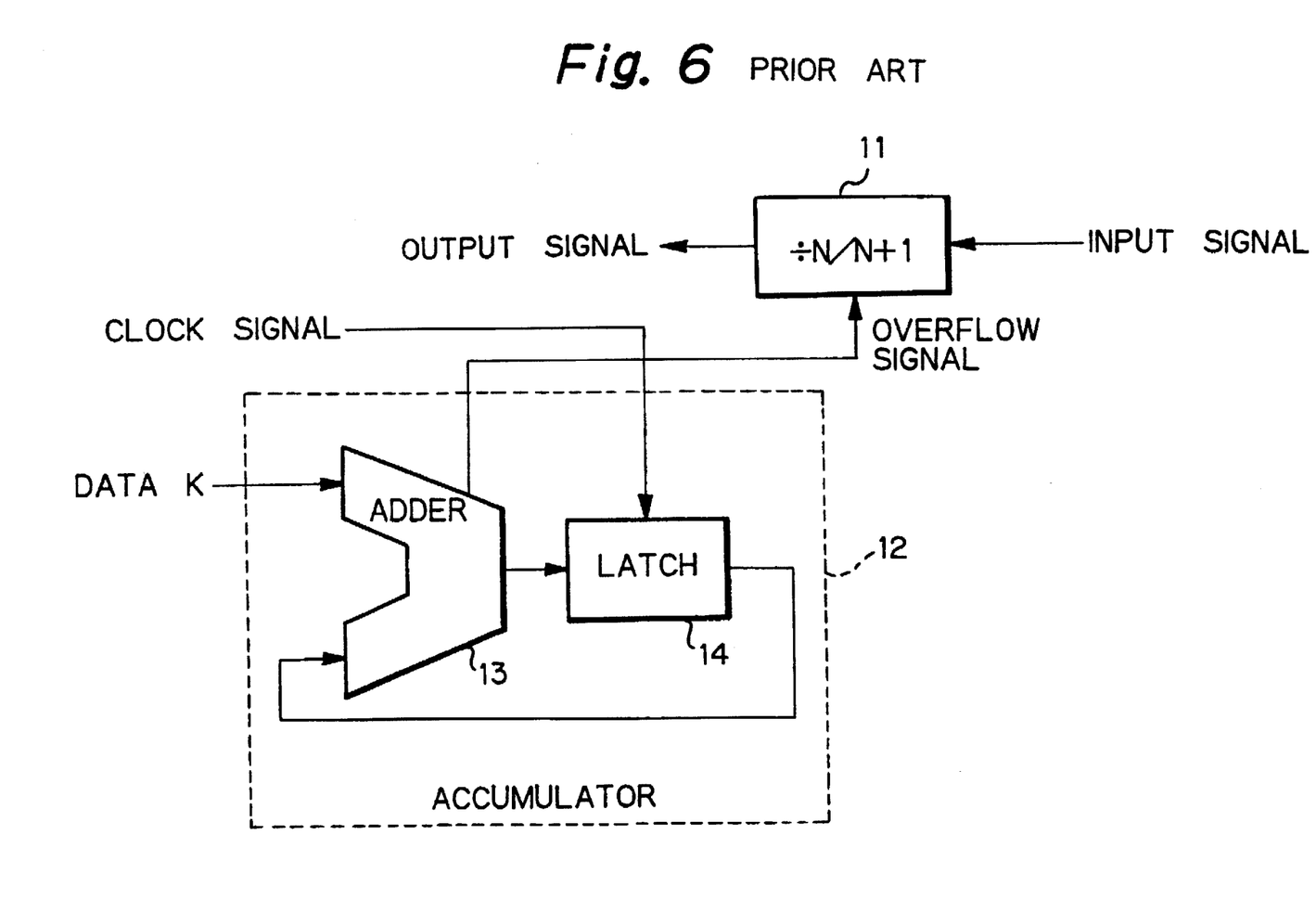
FIG. 6 is a block diagram of a prior frequency divider.

FIG. 6 shows a prior fractional-N frequency divider. In the figure, an accumulator 12 has an n-bit adder 13 and an n-bit latch 14. The accumulator 12 accumulates data K applied to the adder 13 in every input of a clock signal. When the content of the adder 13 amounts to or exceeds $2^n$ during the accumulation operation, the adder 13 sends an overflow signal to a divider 11, which switches division ratio from integer N to N+1 upon receipt of said overflow signal. In that case, the division ratio by the divider 11 is N+1 for K clock times among $2^n$ number of clock times, and N for $(2^n-K)$ clock times. Therefore, the average division ratio $N_{ave}$ during $2^n$ clock times is;

$$N_{ave}=(K(N+1)+(2^n-K)N)/2^n=N+(K/2^n)$$

The average ratio is the sum of the integer part N and the fraction part $K/2^n$.

Figure 7:
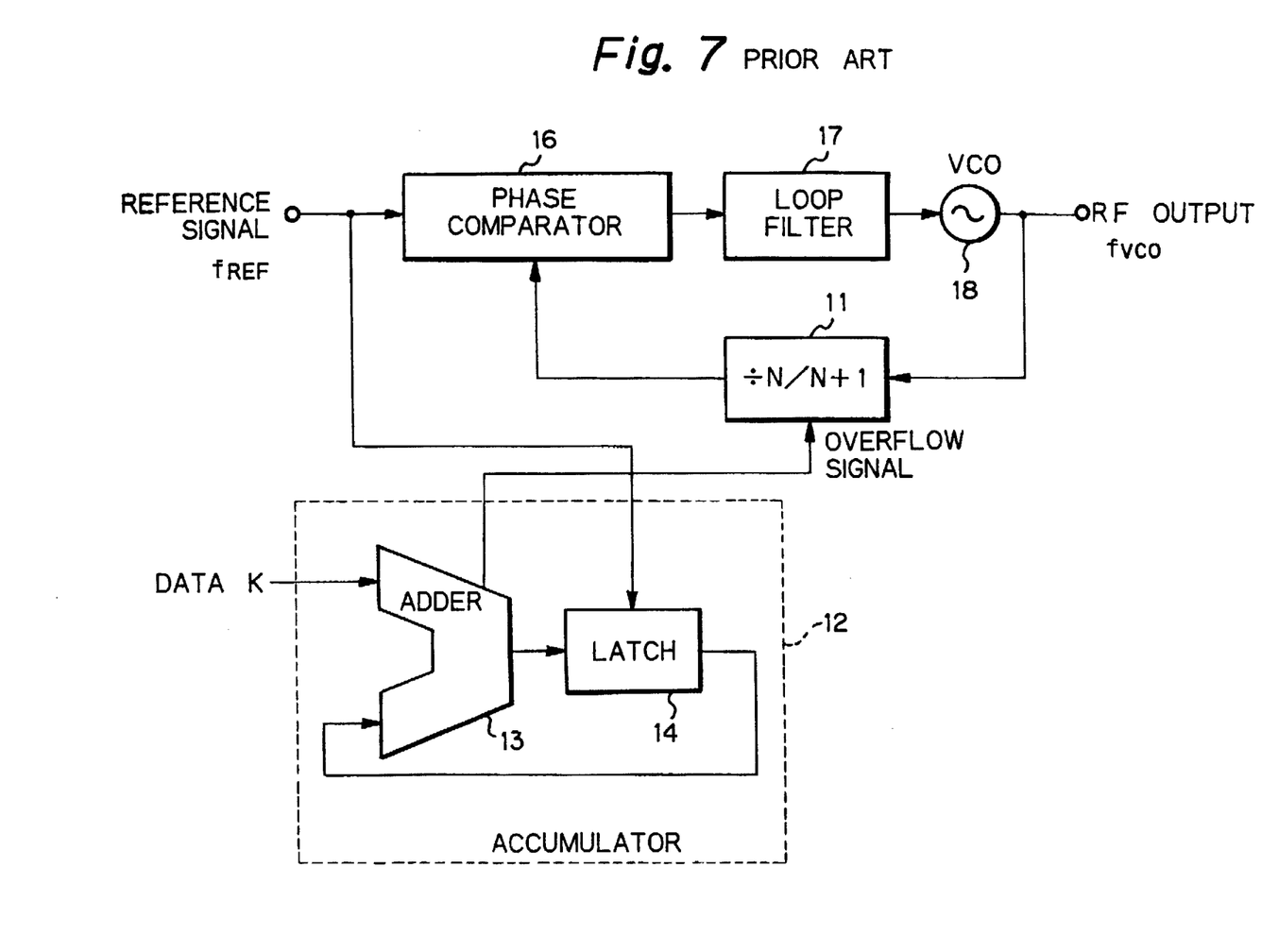
FIG. 7 is a block diagram of a prior frequency synthesizer.

FIG. 7 shows a prior frequency synthesizer which uses a frequency divider of FIG. 6.

In FIG. 7, a phase comparator 16, a loop filter 17 and a voltage controlled oscillator (VCO) 18 constitute a phase lock loop. A reference signal with frequency $f_{REF}$ is applied to the phase comparator 16 and the latch 14. The radio frequency output of the voltage controlled oscillator 18 is applied to the divider 11, which applies the divided frequency to the phase comparator 16.

The oscillation frequency $f_{VCO}$ of a voltage controlled oscillator (VCO) 18 which is phase locked with the reference frequency $f_{REF}$ is;

$$f_{VCO}=N_{ave}\times f_{REF}=(N+K/2^n)\times f_{REF}$$

Therefore, when the data K is incremented or decremented by one, the output frequency $f_{VCO}$ changes with the step frequency which is $1/2^n$ of the reference frequency $f_{REF}$. Therefore, the reference frequency may be higher than step frequency by $2^n$ times.

Generally speaking, when reference frequency is high in a phase lock loop, phase noise characteristics are improved, and high speed frequency switching is obtained.

However, the ratio of the reference frequency to the step frequency in FIG. 7 is fixed to $2^n$, which depends upon number of bits of an accumulator. And therefore, if value n is small, phase noise characteristics and/or frequency switching time is not enough. Further, if we try to have large n, the value K must increment or decrement with step higher than 1, the value $f_{REF}/2^n$ must be smaller than the desired step frequency, and therefore, undesirable adjacent spurious increases. Thus, FIG. 7 has the disadvantage that structure of hardware must be modified for each applications.

Figure 8:
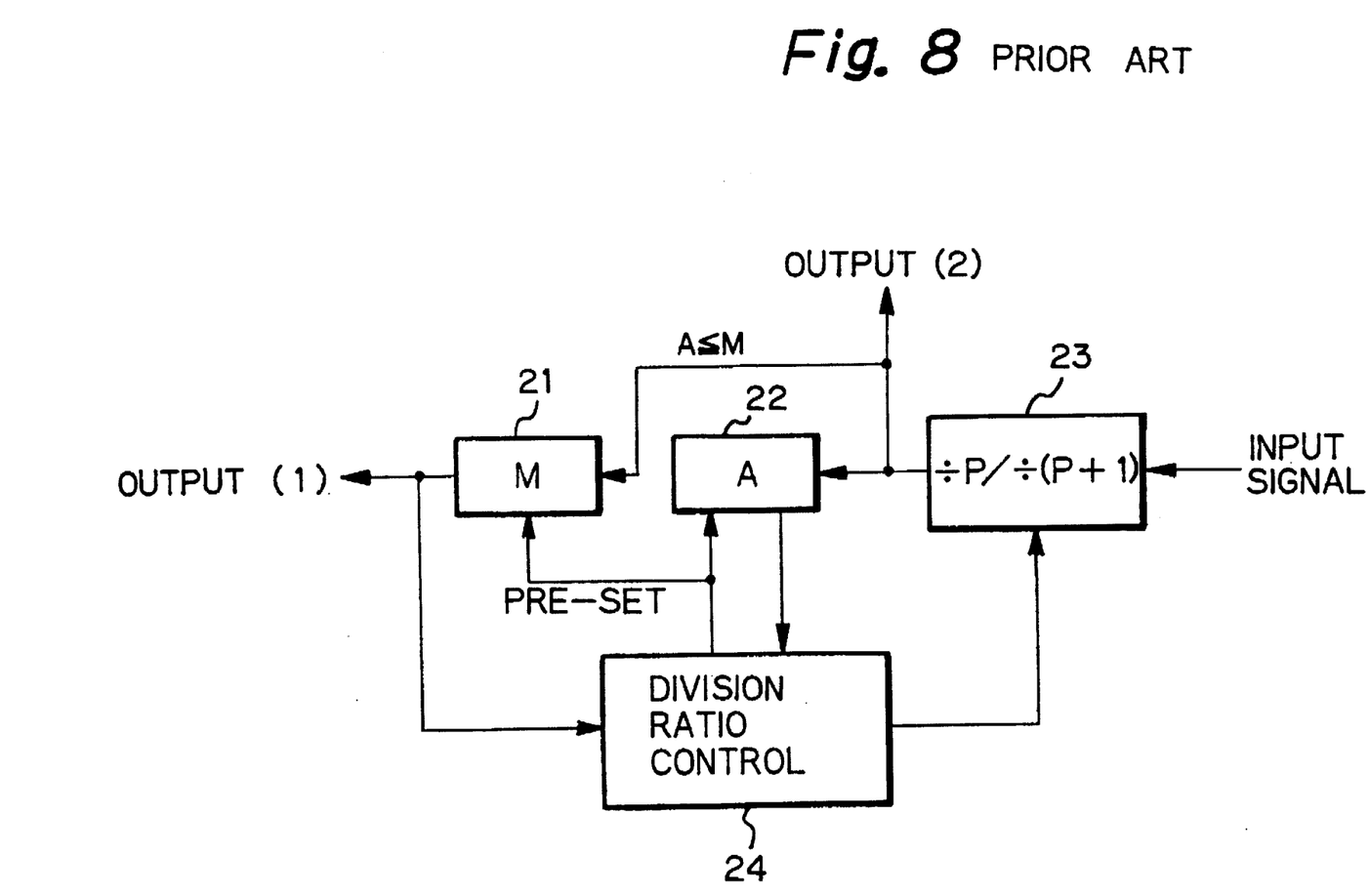
FIG. 8 is a block diagram of a prior pulse swallow counter.

FIG. 8 shows another prior art which switches two frequency division ratios. The circuit of FIG. 8 is called a pulse swallow counter, which has a first programmable counter 21, a second programmable counter 22, a dual modulus prescaler 23 for switching division ratio between integers P and P+1, and a division ratio control 24. Assuming that the content of the first programmable counter 21 is initialized to count M number of pulses, the content of the second programmable counter 22 is initialized to count A number of pulses, A=<M, and the initial frequency division ratio by the dual modulus prescaler 23 is P+1. The output of the dual modulus prescaler 23 is applied to both the first programmable counter 21 and the second programmable counter 22. When (A) number of inputs are applied to the second programmable counter 22, the content of the second programmable counter reaches zero, and the division ratio control 24 switches the division ratio of the divider 23 from P+1 to P. Then, when further (M−A) number of inputs are applied to the counters, the content of the first programmable counter 21 reaches zero, the division ratio control 24 switches the division ratio of the divider from P to P+1, and the first programmable counter 21 and the second programmable counter 22 are initialized.

Conventionally, an output of a pulse swallow counter is taken from a first programmable counter 21 so that the division ratio PM+A (integer) is obtained.

We have considered the improvement of a prior pulse swallow counter so that an output is taken from an output of a dual modulus prescale counter 23 which switches division ratio between P and P+1, so that fractional-N division ratio is obtained. As the division ratio of the counter 23 is P+1 for (A) number of inputs among M number of inputs, and P for (M−A) number of inputs among M number of inputs, the average division ratio $P_{AVE}$ among M cycles is;

$$P_{AVE}=P+A/M$$

The division ratio $P_{AVE}$ is the sum of the integer part P and the fraction part A/M.

A frequency synthesizer using a fractional-N divider as mentioned above is shown in FIG. 9.

Figure 9:
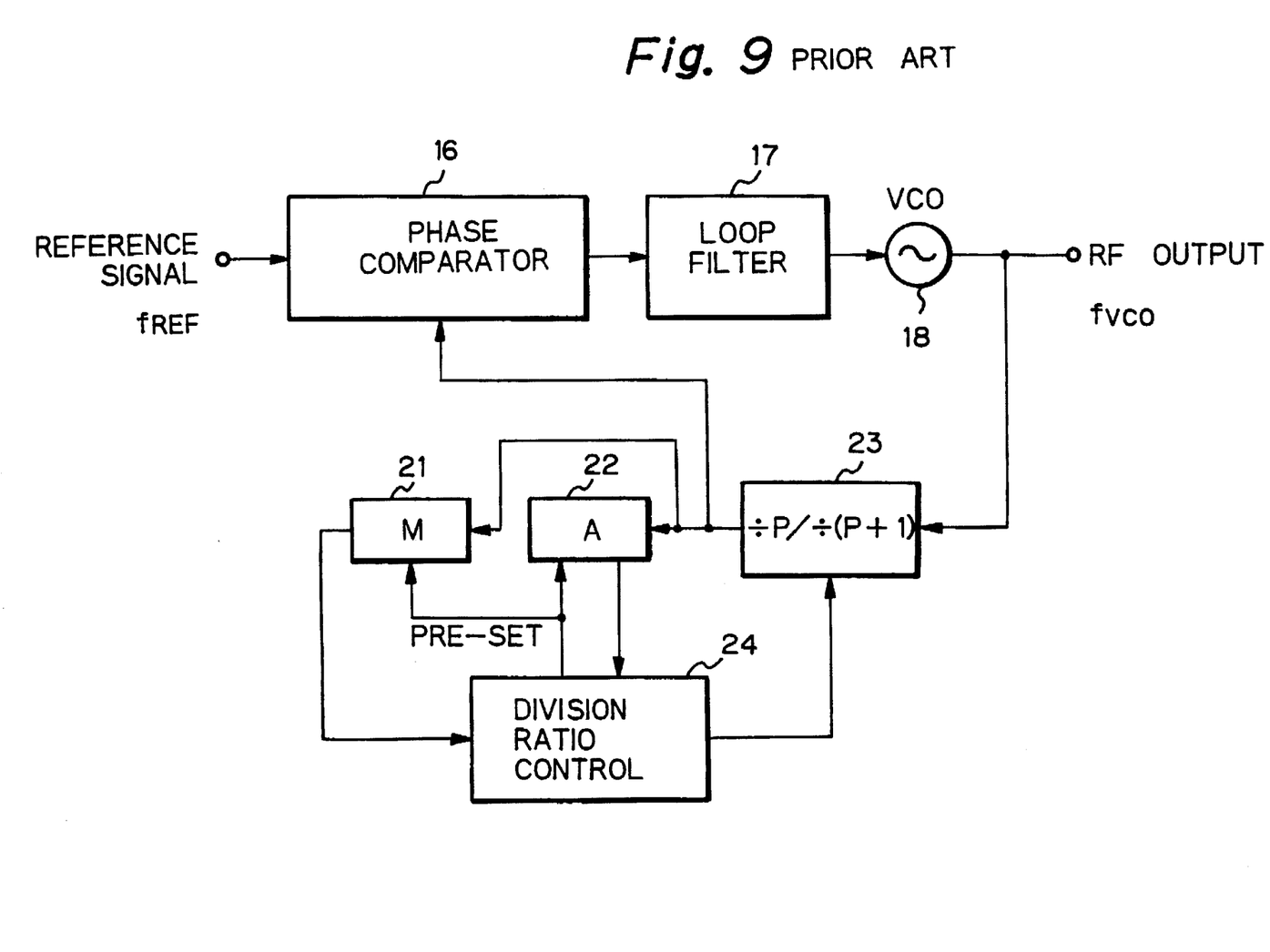
FIG. 9 is a block diagram of a prior frequency synthesizer using a prior frequency divider in FIG. 8.

In FIG. 9, a phase comparator 16, a loop filter 17, a voltage controlled oscillator (VCO) 18, and a divider 23 constitute a phase lock loop. A reference signal with frequency $f_{REF}$ is applied to the phase comparator 16, which also receives an output of the divider 23. The radio frequency $f_{VCO}$ of the output of the voltage controlled oscillator 18 is applied to the divider 23, which applies the divided frequency to the phase comparator 16.

The oscillation frequency $f_{vco}$ of the voltage controlled oscillator 18 when it is phase-locked is;

$$f_{vco}=P_{AVE}\times f_{ref}=(P+A/M)f_{ref}$$

It is noted that the oscillation frequency $f_{vco}$ changes with the step 1/M of the reference frequency $f_{ref}$ by changing the initial value A of the second programmable counter 22.

3

However, the structure of FIGS. 8 and 9 has the disadvantage that the division ratio of a dual modulus prescaler is fixed (for instance 4 and 5 when P=4, or 64 and 65 when P=64), since the value P is fixed but not adjustable. And therefore, the range of the change of $f_{vco}$ is limited to the range from $(P \times f_{ref})$ to $[(P+1) \times f_{ref}]$. In other words, the range of the change of $f_{vco}$ is limited close to $f_{ref}$.

SUMMARY OF THE INVENTION

It is an object, therefore, of the present invention to overcome the disadvantages and limitations of a prior frequency divider by providing a new and improved frequency divider.

It is also an object of the present invention to provide a fractional-N frequency divider in which an integer part, and both a numerator and a denominator of a fractional part are independently adjustable.

It is also an object of the present invention to provide a frequency synthesizer which uses said frequency divider.

The above an other objects are attained by a fractional-N frequency divider for providing fractional-N division ratio (N+A/M), where N, A and M being an integer, comprising; a programmable divider for dividing input frequency of input pulses with division ratio N or N+1 based upon division ratio set data and providing divided output frequency, a selector accepting two external integers (N, N+1) so that one of said integers is applied to said programmable divider as a division ratio set data based upon logical condition of a selection signal, a fraction part set coupled with said output frequency of said programmable divider to provide said selection signal, said fraction part set having two counters initialized to different values (M, A) and counting an output pulse of said programmable divider to provide a first selection signal to select division ratio N for M−A number of output pulses among M number of output pulses of said programmable divider and a second selection signal to select division ratio N+1 for A number of output pulses among M number of output pulses of said programmable divider.

BRIEF DESCRIPTION OF THE DRAWINGS

The foregoing and other objects, features, and attendant advantages of the present invention will be appreciated as the same become better understood by means of the following description and accompanying drawings wherein.

4

DESCRIPTION OF THE PREFERRED EMBODIMENTS

Figure 1:
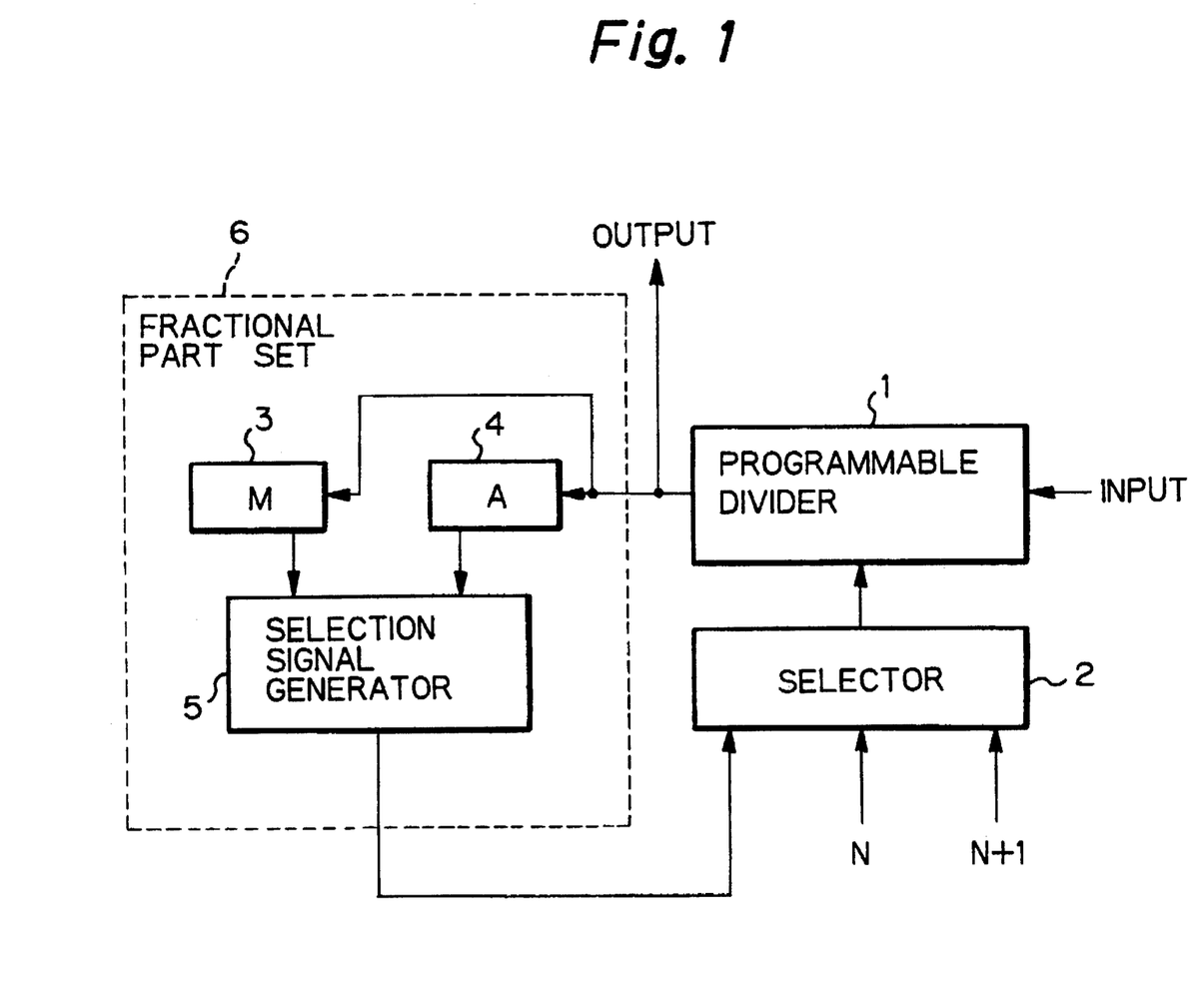
FIG. 1 is a block diagram of a fractional-N frequency divider according to the present invention.

FIG. 1 shows a block diagram of a fractional-N frequency divider according to the present invention. In the figure, the numeral 1 is a programmable divider in which frequency division ratio is adjustable based upon an external frequency division ratio set data. The divider 1 may be implemented either by a single programmable divider, or by combination of a plurality of counters, for instance a pulse swallow counter. The numeral 2 is a selector for selecting one of input data, N or N+1 based upon level (high level or low level) of a selection signal for defining division ratio of the divider 1. The output of the selector 2 is applied to the programmable divider 1 as a frequency division ratio set data. The numeral 3 is a first programmable counter, 4 is a second programmable counter, 5 is a selection signal generator coupled with output of said two counters 3 and 4. The two counters 3 and 4, and the selection signal generator 5 constitute a fractional part set unit 6.

The selection signal generator 5 operates so that a first selection signal is applied to the programmable divider 1 in first condition when content of the first programmable counter 3 which sets denominator of fraction part of frequency division ratio is not zero, and content of the second programmable counter 4 which sets numerator of fraction part of frequency division ratio is zero, and a second selection signal is applied to the programmable counter 1 in second condition except said first condition.

Figure 2:
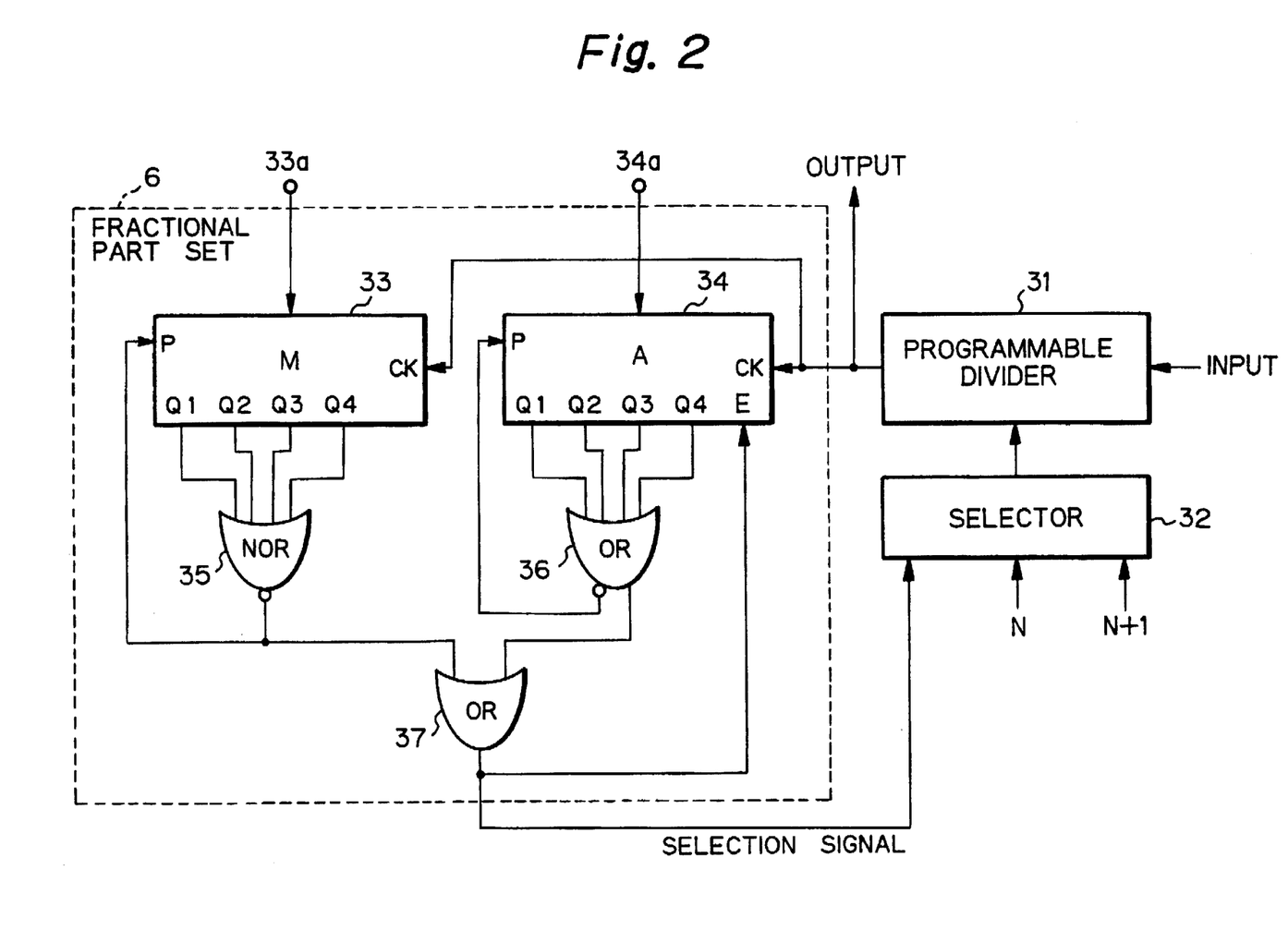
FIG. 2 is a detailed block diagram of a fractional part set 6 in FIG. 1.

FIG. 2 shows a detailed block diagram of a fractional part set unit 6. In the figure, the numeral 31 is a programmable divider, 32 is a selector, 33 is a first programmable counter, 34 is a second programmable counter which has an enable terminal E, 35 is a NOR gate which receives Q output of all the bits of the first programmable counter 33, 36 is an OR gate which receives Q output of all the bits of the second programmable counter 34, 37 is another OR gate which receives outputs of the NOR gate 35 and the OR gate 36. It is assumed in the embodiment that the first programmable counter 33 and the second programmable counter 34 are a 4-bit counter, but the invention is not restricted to that.

Figure 3:
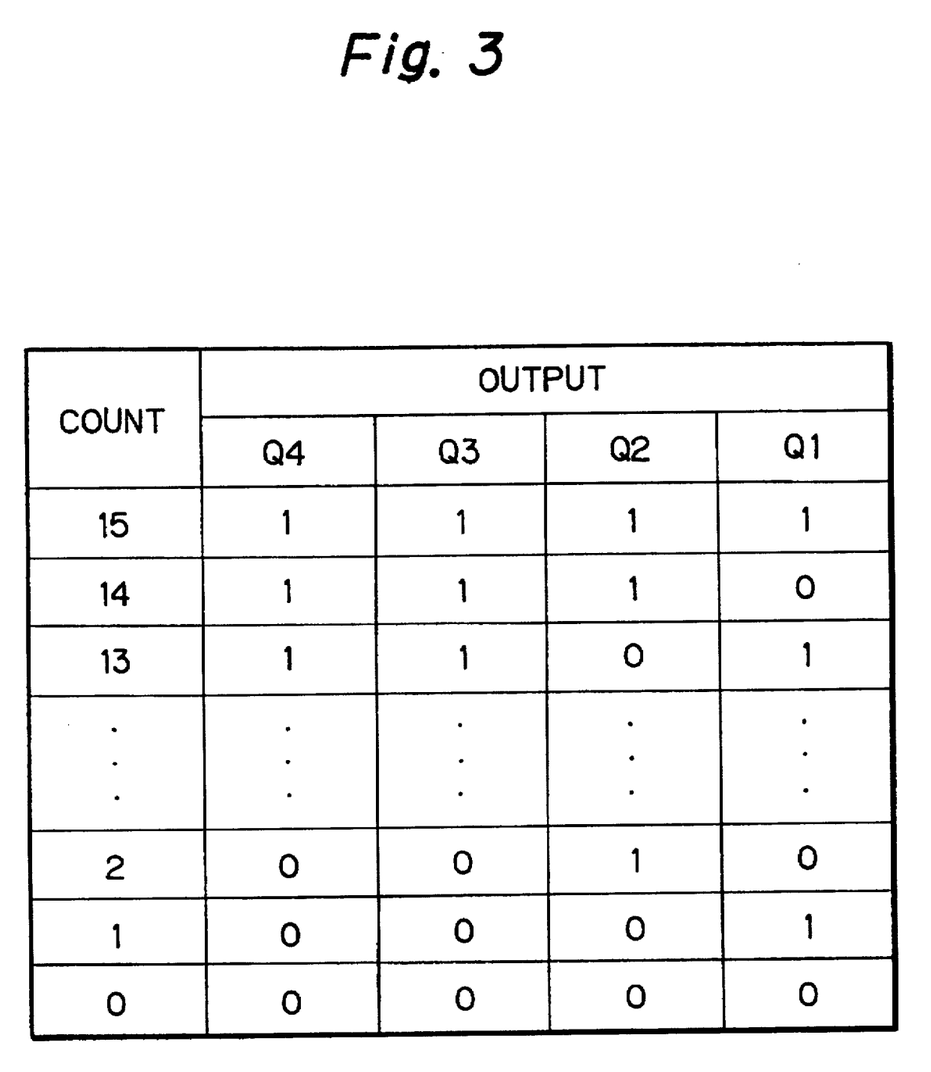
FIG. 3 shows Q-output of a programmable counter in FIG. 1.

FIG. 3 shows Q-output of all the bits (Q1, Q2, Q3, and Q4) of four bit outputs of the first programmable counter and the second programmable counter. It is shown in the binary form with Q4 as the most significant bit (MSB). Assuming that the programmable counter is a down-counter and the initial value of the counter is X−1 for counting X number of pulses. When a clock pulse is applied to the clock input terminal CK of the programmable counter, the content of the counter is decremented by one. And, when the content of the counter reaches zero, the content of the counter is initialized to X−1 again by the next clock pulse.

The terminal E of the second programmable counter is called an enable terminal which functions to make the counter operate to count only when input signal to the terminal E is in high state, but not to count when input signal to the terminal E is in low state.

Figure 4:
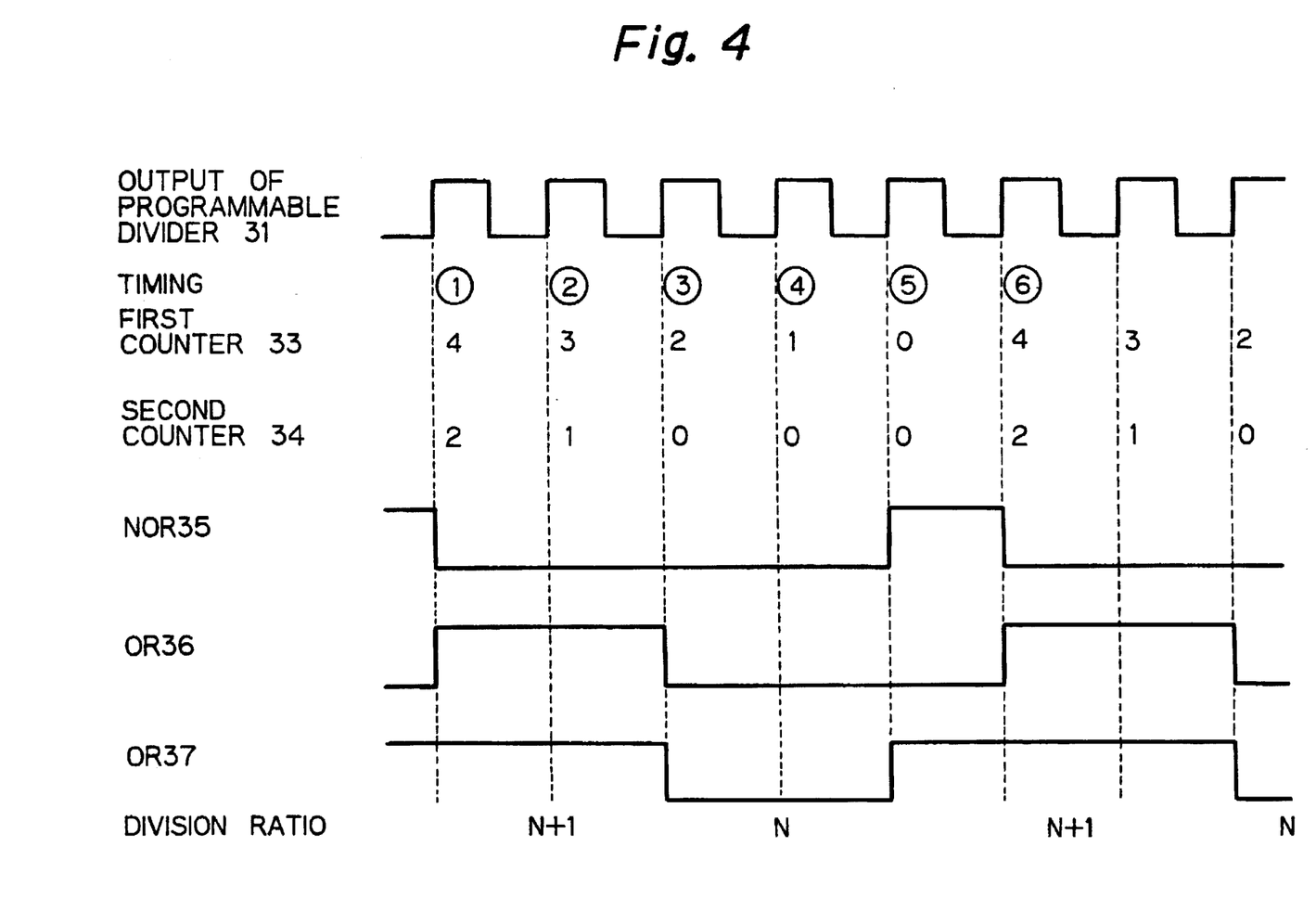
FIG. 4 shows a timing diagram of a fractional-N divider in FIG. 1.

FIG. 4 shows a timing diagram of a fractional-N frequency divider according to the present invention. It is assumed in the embodiment that the initial value (M−1) of the first programmable counter 33 is 4 for counting M(=5) number of pulses, and the initial value (A−1) of the second programmable counter 34 is 2 for counting A(=3) number of pulses.

The content of the first programmable counter 33 is decremented by one when an output of the programmable divider 31 is applied to the clock input terminal CK, and the content of the same reaches zero at timing (5). Therefore, all the Q-outputs (Q1, Q2, Q3, Q4) are zero, and output of the NOR gate 35 changes from low state to high state.

The content of the second programmable counter 34 is decremented by one when an output of the programmable divider 31 is applied to the clock input terminal CK of the second programmable counter 34, and the content of the same reaches zero at timing (3). Therefore, all the Q-outputs (Q1, Q2, Q3, Q4) are zero, and output of the OR gate 36 changes from high state to low state, and simultaneously, output of the OR gate 37 changes from high state to low state. As the output of the OR gate 37 is applied to the enable terminal E of the second programmable counter 34, the second programmable counter 34 stops the count operation at timing (3) because of the low state at the enable terminal E. The enable terminal E changes to high state at timing (5), and the second programmable counter 34 is initialized to the value 2 and begins again the count operation at the next clock edge timing (6).

Accordingly, output of the OR gate 37 is high for A times among M number of outputs of the programmable divider 31, and is low for (M−A) times. The output of the OR gate 37 is applied to the selector 32 as a selection signal. The selector 32 operates so that the frequency division ratio of the programmable divider 31 is N+1 when the selection signal is in high state, and the frequency division ratio is N when the selection signal is in low state. Then, the average division ratio $N_{AVE}$ of the programmable divider 31 among M cycles is;

$$N_{AVE}=[A\times(N+1)+(M-A)\times N]/M=N+A/M$$

Therefore, the division ratio is expressed by an integer part N, and a fraction part A/M, and so, the programmable divider operates as a fractional-N frequency divider. It is assumed that A=<M.

It should be noted in the above expression that both of the numerator part A, and the denominator part M of the fraction part of the average division ratio may be adjustable by adjusting initial value of programmable counters 33 and 34. And, the integer part N is also adjustable by adjusting an input (N, N+1) to the selector 32. Further, it should be noted that the switching of division ratio between N and N+1 is implemented by a simple circuit structure merely by switching an input to the programmable divider 31 by using the selector 32, and therefore, the high speed operation is possible.

The counters 33 and 34 have a preset terminal P. When the output of the NOR gate 35 is applied to the preset terminal P of the counter 33, the counter 33 is initialized to M−1 by forwarding the value M−1 to the counter 33 through the terminal 33a, for counting M number of pulses. Similarly, when the inversion of the output of the OR gate 36 is applied to the preset terminal P of the counter 34, and the enable signal E is high, the counter 34 is initialized to A−1 by forwarding the value A−1 to the counter 34 through the terminal 34a, for counting A number of pulses.

Figure 5:
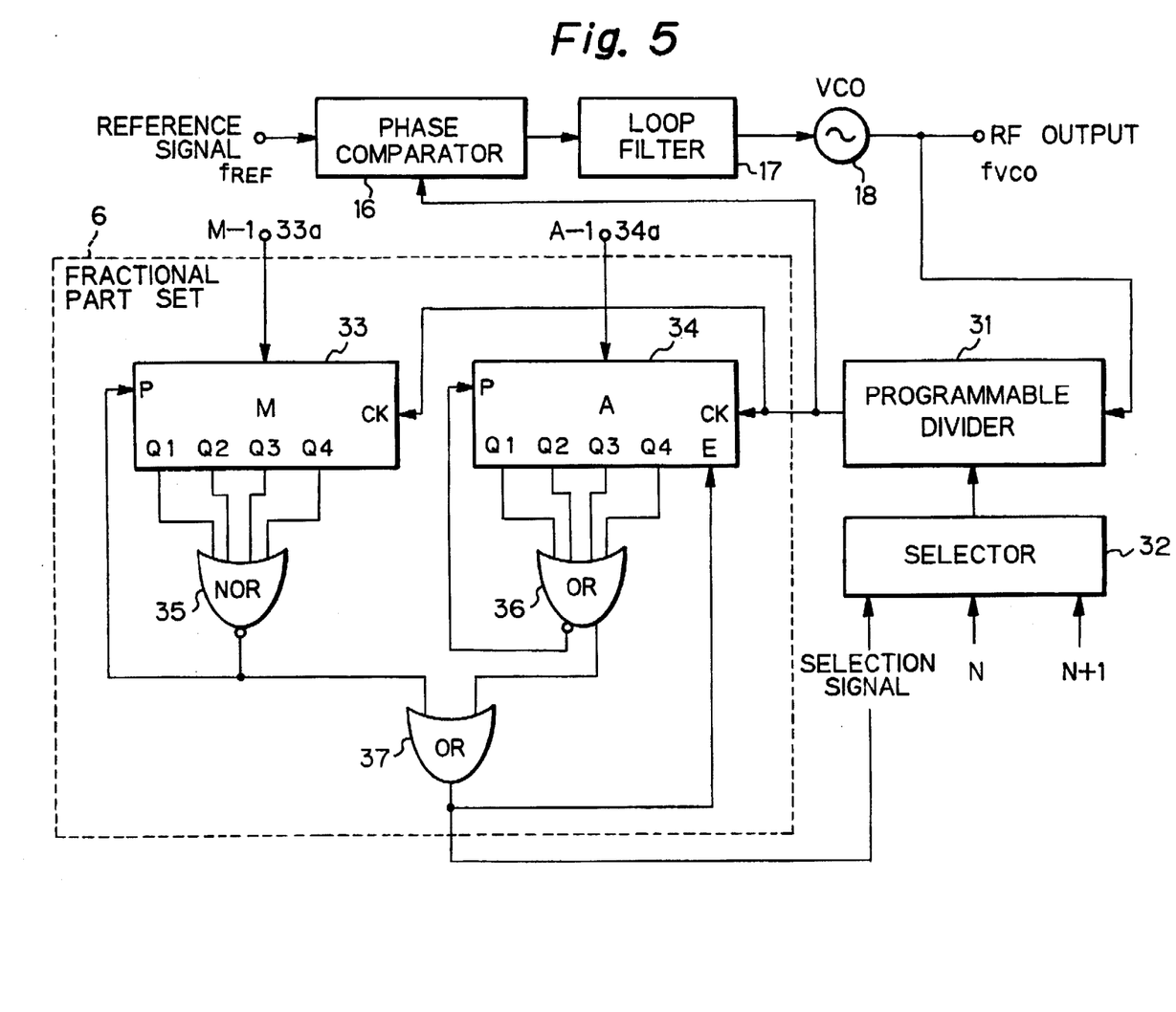
FIG. 5 is a block diagram of a frequency synthesizer using a frequency divider in FIG. 1.

FIG. 5 is a block diagram of a fractional-N frequency synthesizer which uses a fractional-N frequency divider according to the present invention.

In FIG. 5, the numeral 16 is a phase comparator which accepts reference signal $f_{REF}$ and output of the frequency divider (output of the programmable divider 31). The numeral 17 is a loop filter, and 18 is a voltage controlled oscillator (VCO) which provides radio frequency output signal $f_{VCO}$. The radio frequency $f_{VCO}$ is applied to the programmable divider 31 as an input pulse, and the divided frequency by the divider 31 is applied to the phase comparator 16. So, the members 16, 17, 18 and 31 constitute a phase lock loop, and the radio frequency $f_{VCO}$ is locked to the reference signal $f_{REF}$ based upon the division ratio of the frequency divider.

The oscillation frequency $f_{vco}$ in phase lock condition is;

$$f_{VCO}=N_{AVE}\times f_{REF}=(N+A/M)\times f_{REF}$$

Therefore, when the set value A of the second programmable counter is changed by one, the oscillation frequency $f_{VCO}$ changes with the step frequency of 1/M of the reference frequency $f_{REF}$. As the value M is adjustable, the reference frequency is independent upon the step frequency, and therefore, the optimum reference frequency is selected for low phase noise and quick frequency switching characteristics.

The present invention has the advantage that a common reference frequency may be used for the applications which have different step frequency with each other, and so, a communication system may be constructed with low cost, and further, since the value N is also variable, the oscillation frequency $f_{VCO}$ may extend to the whole frequency range of a voltage controlled oscillator VCO.

Figure 10:
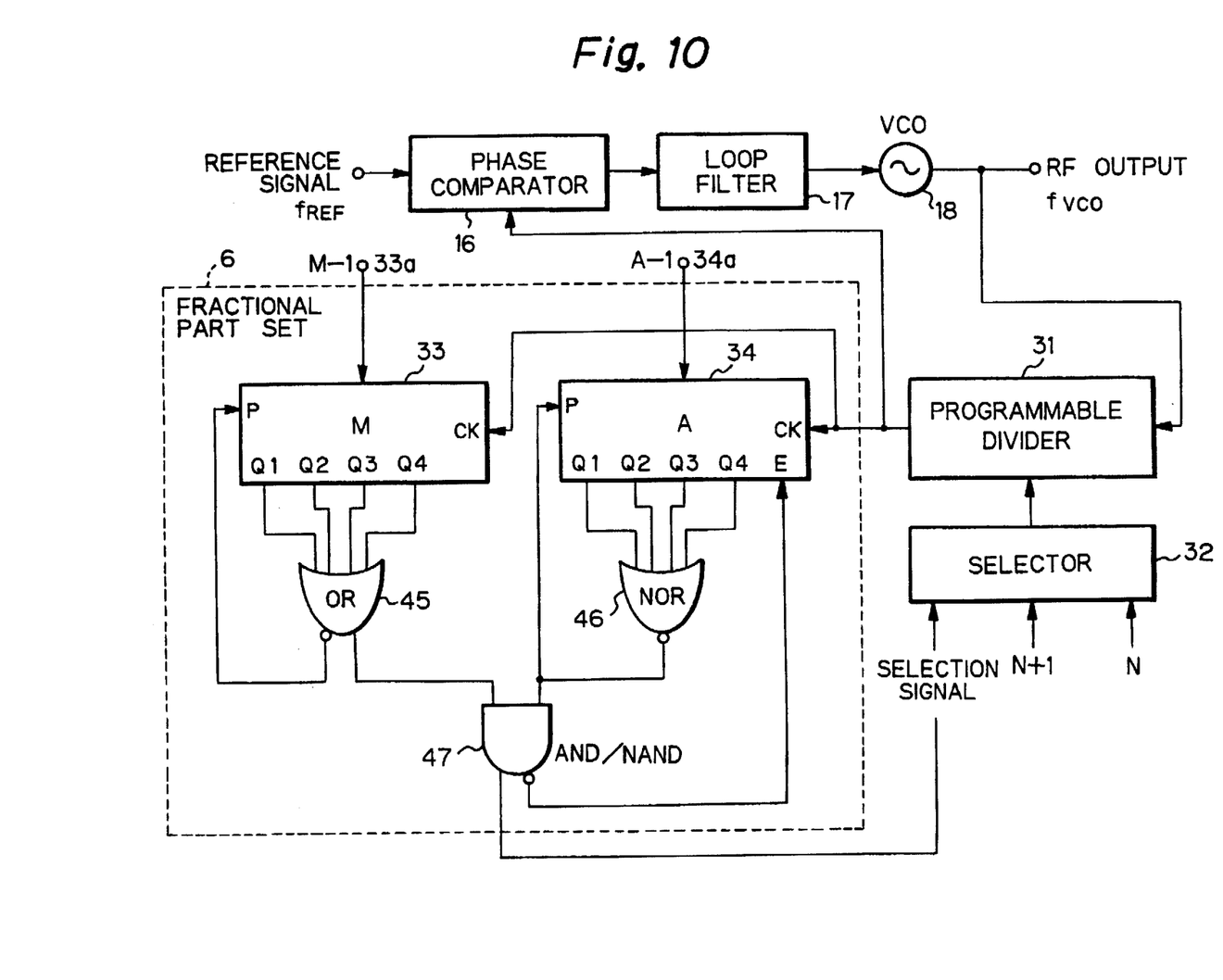
FIG. 10 is another embodiment of a frequency synthesizer according to the present invention.

FIG. 10 shows a modification of FIG. 5. The feature of FIG. 10 is the modification of the fraction part set 6. In FIG.10, the Q-output of the first programmable counter 33 is applied to the OR gate 45, and the Q-output of the second programmable counter 34 is applied to the NOR gate 46. The outputs of the OR gate 45 and the NOR gate 46 are applied to the AND/NAND gate 47. The NAND output of the AND/NAND gate 47 which is logically the same as that of the OR gate 37 in FIG. 5 operates as enable signal E for the second programmable counter 34. The AND output of the AND/NAND gate 47 is applied to the selector 32 as a selection signal.

The counter 33 is initialized to M−1 through the terminal 33a when the inversion of the OR gate 45 provides a positive output signal, and the counter 34 is initialized to A−1 through the terminal 34a when the NOR gate 46 provides a positive output signal and high enable signal is applied to the enable terminal E.

If the division ratio N is selected when the selection signal is high, and the division ratio N+1 is selected when the selection signal is low, it is phase-locked with the same frequency as that of FIG. 5.

Figure 11:
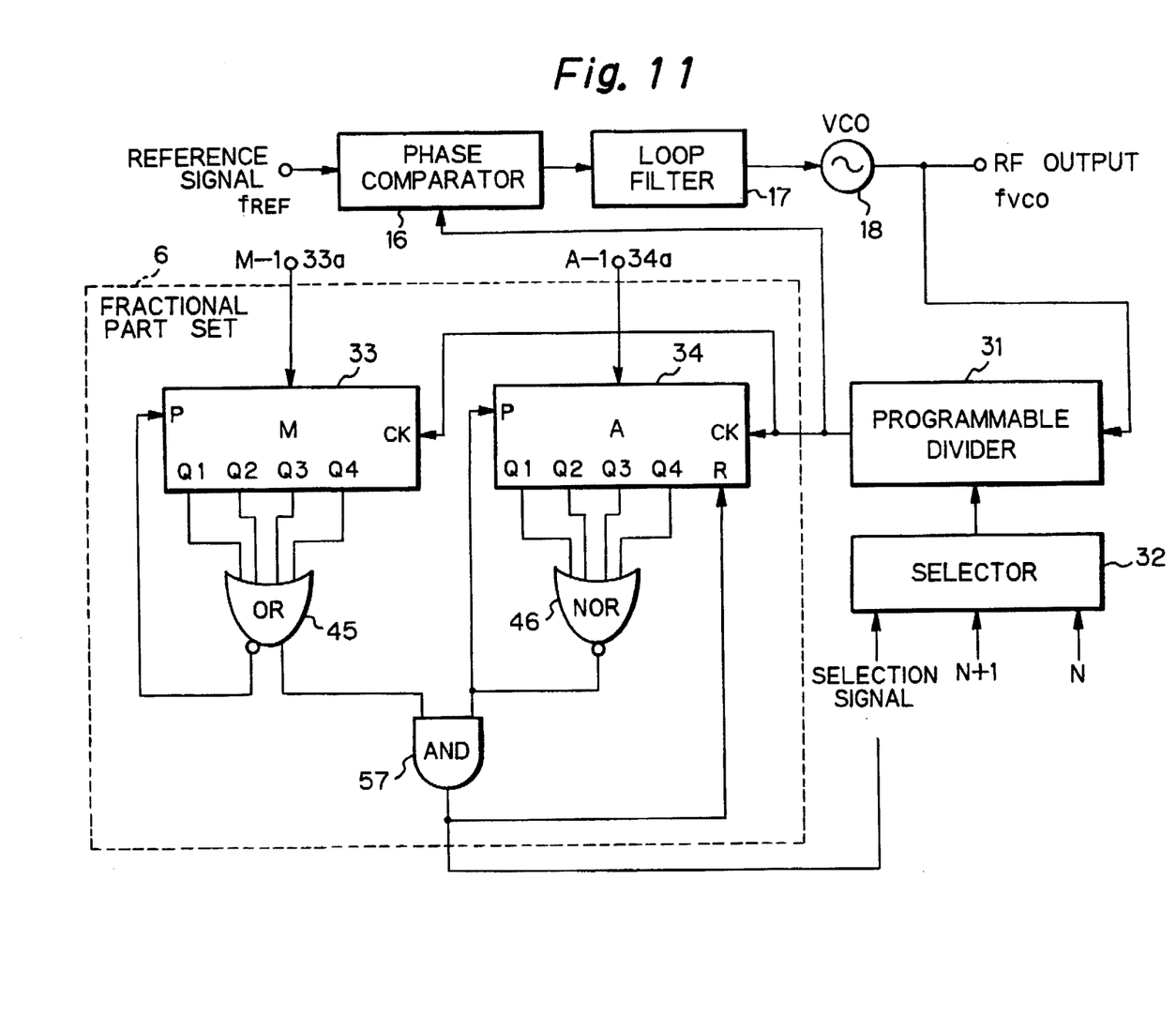
FIG. 11 is still another embodiment of a frequency synthesizer according to the present invention.

FIG. 11 is another modification of a fractional-N frequency synthesizer according to the present invention, and the feature of FIG. 11 is also in the structure of the fraction part set 6. In FIG. 11, the second programmable counter 34 has a reset terminal R. The operation of the reset terminal R is opposite to the operation of an enable terminal E. So, when an input signal to the reset terminal R is high, the counter does not count, and when an input signal to the reset terminal R is low, the counter operates to count. As the output of the AND gate 57 is applied to the reset terminal R of the second programmable counter 34, the fraction part set 6 in FIG. 11 operates logically the same as that of FIG. 10. In FIG. 11, the division ratio N is selected when the output of the AND gate 57 is high, and the division ratio N+1 is selected when the output of the AND gate 57 is low. The oscillation frequency in phase lock condition in FIG. 11 is the same as that of FIG. 10.

The structure of a fraction part set 6 is not restricted to the embodiments and the modifications, but many modifications are possible to those skilled in the art so long as a first selection signal is provided in a first condition when content of a programmable counter which sets a denominator is not zero and content of another programmable counter which sets a numerator is zero, and a second selection signal is provided in a second condition except for the first condition.

Further, a first programmable counter and a second programmable counter are not restricted to a down-counter, but an up-counter is possible. In that case, when a counter is designed to count X number of pulses, a programmable counter is initialized to zero, and is incremented one by one when a clock pulse is applied to a clock terminal CK, and returns to zero by a clock pulse when content reaches X−1.

Further, a first programmable counter and a second programmable counter are not restricted that initial value and/or final value is zero, but any initial value and/or final value is possible so long as a counter counts a predetermined number of clock pulses (A or M).

As mentioned above in detail, according to the present invention, an integer part, a numerator part, and a denominator part of a fractional-N frequency divider are variable. Therefore, when said frequency divider is used to a fractional-N frequency synthesizer, excellent low phase noise and frequency switching characteristics are achieved. Further, a common reference frequency may be used to a plurality of applications which have different step frequencies.

From the foregoing it has now been apparent that a new and improved fractional-N frequency divider has been found. It should be appreciated of course that the embodiments disclosed are merely illustrative and are not intended to limit the scope of the invention. Reference should be made to the appended claims, therefore, for indicating the scope of the invention.

What is claimed is:

1. A fractional-N frequency divider system for providing fractional-N division ratio N+A/M, where N, A and M being an integer, comprising;

a programmable divider for dividing input frequency of input pulses with division ratio N or N+1 based upon division ratio set data and for providing divided output frequency, a selector accepting two external integers N, N+1 so that one of said integers is applied to said programmable divider as the division ratio set data based upon logical condition of a selection signal, a fraction part set coupled with said output frequency of said programmable divider to provide said selection signal, said fraction part set having first and second counters initialized to different count values M, A and each counting an output pulse of said programmable divider to provide a first selection signal to select division ratio N for M−A number of output pulses among M number of output pulses of said programmable divider and a second selection signal to select division ratio N+1 for A number of output pulses among M number of output pulses of said programmable divider.

2. A fractional-N frequency divider system according to claim 1, wherein said fractional part set comprises;

said first counter coupled with said programmable divider to provide an output signal upon counting M number of pulses, said second counter coupled with said programmable divider to provide an output signal and stop counting operation upon counting A number of pulses until said first counter provides an output signal after counting M number of pulses, a selection signal generator for providing said first selection signal in first condition when content of said first counter is not zero and content of said second counter is zero, and said second selection signal in second condition except said first condition.

3. A fractional-N frequency divider system according to claim 2, further comprising;

a phase comparator receiving reference signal and output of said programmable divider, a loop filter receiving output of said phase comparator, a voltage controlled oscillator coupled with output of said loop filter to provide ratio frequency output which is also supplied to input of said programmable divider, wherein said ratio frequency output is locked with said reference signal with division ratio N+A/M.

4. A fractional-N frequency divider system according to claim 2, wherein;

said first counter is initialized to provide an output signal upon counting M number of pulses, said second counter is initialized to provide an output signal upon counting A number of pulses, said selection signal generator has a NOR gate receiving output of each bits of said first counter, a first OR gate receiving output of each bits of said second counter, and a second OR gate receiving output of said NOR gate and output of said first OR gate to provide said selection signal to said selector, and said second counter has an enable terminal coupled with output of said second OR gate to stop counting operation of said second counter upon receiving a low level output signal of said second OR gate.

5. A fractional-N frequency divider system according to claim 4, wherein each of said first counter and said second counter has a preset terminal which initializes each of said counters when said counters count M and A number of pulses, respectively.

6. A fractional-N frequency divider system according to claim 4, wherein said first counter is initialized to M−1 and said second counter is initialized to A−1.

7. A fractional-N frequency divider system according to claim 2, wherein;

said first counter is initialized to provide an output signal upon counting M number of pulses, said second counter is initialized to provide an output signal upon counting A number of pulses, said selection signal generator has an OR gate receiving output of each bits of said first counter, a NOR gate receiving output of each bits of said second counter, and an AND/NAND gate receiving output of said OR gate and output of said NOR gate to provide said selection signal to said selector, and said second counter has an enable terminal coupled with a NAND output of said AND/NAND gate to stop counting operation of said second counter upon receiving a low level output signal of said AND/NAND gate.

8. A fractional-N frequency divider system according to claim 2, wherein;

said first counter is initialized to provide an output signal upon counting M number of pulses, said second counter is initialized to provide an output signal upon counting A number of pulses, said selection signal generator has an OR gate receiving output of each bits of said first counter, a NOR gate receiving output of each bits of said second counter, and an AND gate receiving output of said OR gate and output of said NOR gate to provide said selection signal to said selector, and said second counter has a reset terminal coupled with output of said AND gate to stop counting operation of said second counter upon receiving a high level output signal of said AND gate.

* * * * *